United States Patent

[11] 3,612,698

[72] Inventor Einar S. Mathisen
Poughkeepsie, N.Y.

[21] Appl. No. 820,983
[22] Filed May 1, 1969
[45] Patented Oct. 12, 1971

[73] Assignee International Business Machines Corporation
Armonk, N.Y.

[54] AUTOMATIC HOLOGRAPHIC WAFER POSITIONING SYSTEM AND METHOD
9 Claims, 4 Drawing Figs.

[52] U.S. Cl. .......... 356/141, 350/3.5, 356/152
[51] Int. Cl. .......... G01b 11/26
[50] Field of Search .......... 29/574, 569, 578, 579; 356/152, 141, 158; 250/216; 350/3.5

[56] References Cited

UNITED STATES PATENTS

| | | | |
|---|---|---|---|
| 3,458,925 | 8/1969 | Napier .......... | 29/578 |
| 3,473,979 | 10/1969 | Haenichen .......... | 29/578 X |

*Primary Examiner*—Rodney D. Bennett, Jr.
*Assistant Examiner*—J. M. Potenza
*Attorney*—Sughrue, Rothwell, Mion, Zinn & Macpeak

ABSTRACT: System and method for automatic alignment of workpieces such as semiconductor wafers and a photomask for subsequent image exposure. Alignment is based on the transparency of the wafers to infrared light and the opaqueness thereto of alignment patterns fabricated in the wafer. A holographic optical system generates a Fourier transformed image of light transmitted through the wafer and cross-correlates the transformed image with a complex spatial filter to generate recognition spots of light having spot displacements corresponding to the waferfilter nonalignment. The spot displacements generate an error signal used to control the wafer position.

INVENTOR
EINAR S. MATHISEN

BY Sughrue, Rothwell, Mion, Zinn & Macpeak
ATTORNEYS

INVENTOR
EINAR S. MATHISEN

BY Sughrue, Rothwell, Mion, Zinn & Macpeak
ATTORNEYS

AUTOMATIC HOLOGRAPHIC WAFER POSITIONING SYSTEM AND METHOD

BACKGROUND OF THE INVENTION

1. Field of the Invention

The invention relates to a system and method for generating holographic recognition spots used to aid in alignment of parts, workpieces and the like. More particularly, the invention relates to automatic alignment of semiconductor wafers and a mask for subsequent photoresist exposure.

2. Description of the Prior Art

The use of the holographic technique of spatial filtering to generate recognition spots is known. See, for example, Horvath et al., "Holographic Technique Recognizes Fingerprints," *Laser Focus* June 1967, 18–23. A mathematical analysis of spatial-filtering techniques is given by Vander Lugt, "A Review of Optical Data-Process Techniques," *Optica Acta*, Vol. 15, No. 1, 1968, pages 1–33. The presently used step of manual alignment of the wafer with the photomask is one of the most costly and tedious in the semiconductor processing field. The manual alignment step is a distinct disadvantage in the prior art systems of semiconductor manufacture.

SUMMARY OF THE INVENTION

The present invention is an automatic alignment system for semiconductor wafers which eliminates the previously necessary, costly and tedious manual alignment. A holographic system generates recognition spots corresponding to regions of the wafer. The displacements of the spots, indicative of the displacement of the wafer, are used to generate error signals to correct the wafer position.

DESCRIPTION OF THE PREFERRED EMBODIMENTS

Figure 1:
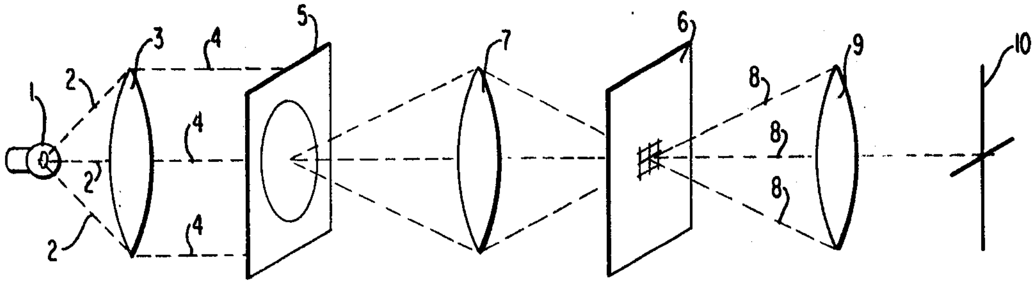
FIG. 1 is an illustration of the spatial-filtering techniques used in a holographic displacement detector.

Fig. 1 illustrates the basic principle of a holographic displacement detector as used in this invention. A source 1 of monochromatic light, preferably in the infra-red region, produces a diverging beam 2 of light which is collimated by a collimation lens 3 to produce a collimated beam 4 of light. The collimated beam 4 passes through a selectively light transparent (e.g., infra-red) workpiece 5 such as a semiconductor wafer.

The workpiece 5 has a two-dimensional pattern having areas of varying transmissivity of light, and the patterns have a displacement with respect to the optical axis and a spatial filter 6. It is this displacement which is to be detected. Workpiece 5 is placed one focal length from an objective lens 7, which receives the light passing through workpiece 5.

Thus the transparent workpiece 5 is in the front focal plane of lens 7. The spatial filter 6 is located one focal length in the rear of lens 7, and is thus in the rear focal plane. Spatial filter 6 is a complex filter or hologram constructed from selected pattern areas in workpiece 5.

It is well known that, in an arrangement as described, the image of the patterns of workpiece 5 as produced in the plane of filter 6 by objective lens 7 is an optical representation of the Fourier transform on the workpiece 5. For this reason, and because a Fourier function is expressed in terms of frequency, the plane in which filter 6 is located is called the "frequency plane."

The interference between the Fourier transform of the selected pattern hereafter referred to as an alignment or reference pattern, and a plane off-axis reference beam is suitably recorded on a recording media placed at the rear focal plane. The complex spatial filter 6 employed contains both the amplitude and phase information of the alignment pattern.

The frequency distribution of the patterns of workpiece 5 containing both desired and extraneous (e.g., integrated circuits) patterns or produced in the plane of the filter 6 is multiplied with the recorded Fourier transform in the complex spatial filter 6.

That part of the field distribution which originates from the reference pattern and corresponds to a high degree of correlation between the image in the frequency plane and the filter results from the cancellation of the curvature of the wave front entering the filter. The portion of the field distribution from the reference pattern with cancelled curvature is focused by a lens 9 on an output plane 10.

That part of the field distribution originating from other than the reference pattern is not modified by the filter and passes, as a curved wave front to the lens 9, which reconstructs a real image in plane 10.

Assuming good correlation between the Fourier transform of reference patter (from workpiece 5) in the frequency plane and the complex spatial filter, the plane wave produced will be converged by lens 9 to a small spot of light, called a "recognition spot." As the workpiece 5 is laterally displaced with respect to the complex spatial filter, the recognition spot will be laterally displaced with respect to the output plane 10. Similarly, as the workpiece 5 is vertically displaced, the recognition spot will be vertically displaced.

However, unless the reference pattern (of workpiece 5) is the same pattern at all angles of rotation, the intensity of the recognition spot will be reduced as the reference pattern is rotated more than about 3° from the relative angle of coincidence with spatial filter 6.

A full planar figure of rotation is defined as a figure which could be produced by rotating about an end point by 360° any line segment having any intensity function associated with each point along the line and thereby creating a planar figure having an intensity function in which each point in the figure has an intensity equal to that of the point on the line which rotated through the point in the figure. The simplest full planar figure of rotation (ignoring the degenerate example of the point) is a circle. Other simple cases include concentric circles, circular bands, and concentric circular bands. These simple geometrical cases include only cases in which intensity has only two values. However, a continuum of intensities is possible, and thus full planar figures of rotation can have a continuum of intensities. However, all points equidistant from the center must have equal intensity.

If the reference pattern of workpiece 5 is full planar figure of rotation, the reference pattern can be rotated by an amount without disturbing the integrity of the recognition spot.

Figure 2:
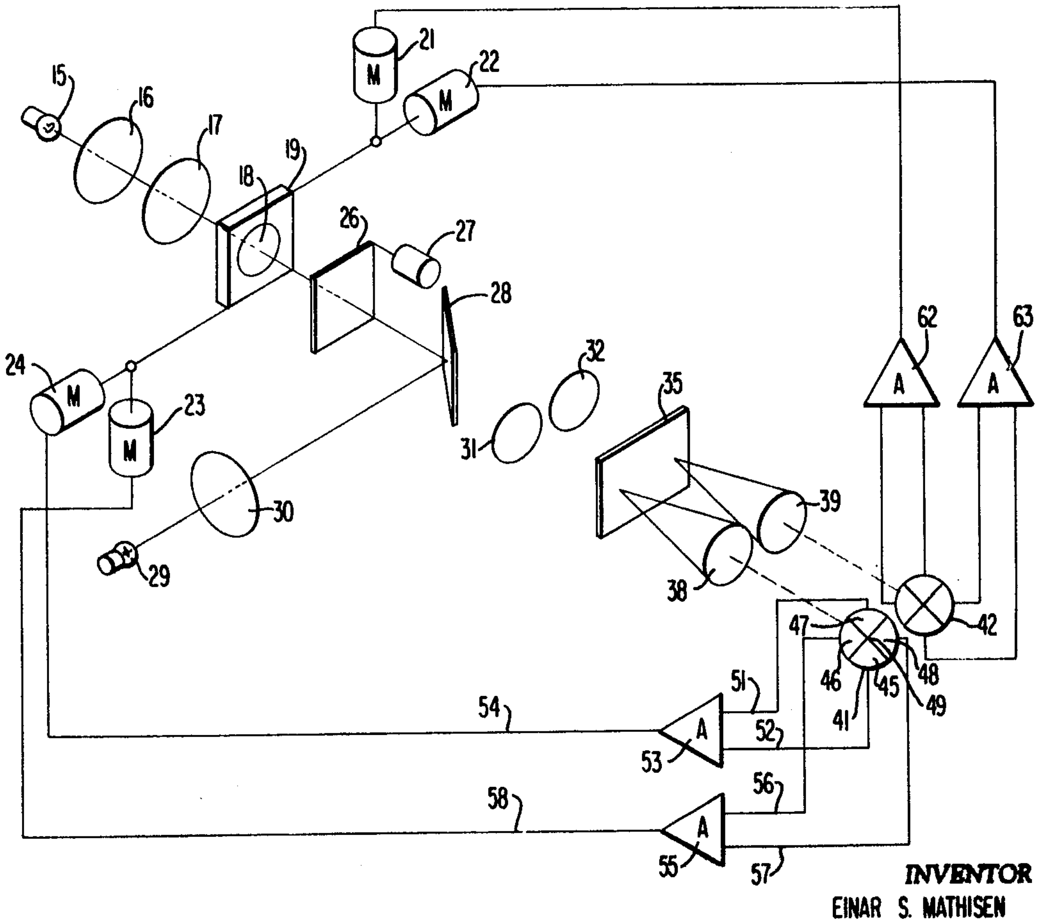
FIG. 2 is an illustration of a holographic displacement correction technique for use in an optical wafer-processing system according to the present invention.

FIG. 2 is a diagram of a holographic displacement correction technique for use in an optical wafer-processing system according to the present invention.

A source 15 of monochromic infrared light produces a beam of light which is filtered by lens pinhole assembly 16 and collimated by a lens 17 to form a collimated beam of light. A semiconductor wafer 18 is placed in a wafer holder 19, and is arranged so that the collimated beam of monochromatic preferably infra-red) light passes through wafer 18.

The two regions containing the alignment or reference patterns are spaced apart on the wafer and are diffused with some optically dissimilar material to form identical full planar figures of rotation in the two regions. More than two such regions could be used, but the use of two regions is illustrated in the preferred embodiment. The method of providing these regions is more fully described in connection with FIG. 4.

Servomotors 21–24 are provided for moving the wafer holder 19, in a manner more fully described below.

A photomask 26, used in the photoresist exposure process in making a semiconductor circuit on wafer 18, is placed adjacent to wafer 18 for alignment with the wafer. A motor 27 is provided to move photomask 26 axially to achieve proper contact between the photomask and wafer during exposure.

A light source 29 provides light to be used in exposing photoresist areas on the wafer through photomask 26 in the manufacturing process. The light from source 29 passes through a lens system 30 and is reflected by a half-silvered mirror 28 through the photomask 26 to the wafer 18. Because the photomask and the wafer must be very closely aligned for the exposure of the wafer to be accurate, the system of FIG. 2 must accurately control the position of the wafer.

The light from source 15 passing through wafer 18, passes through half-silvered mirror 28 and objective lenses 31 and 32 to reach a spatial filter 35 in the system frequency plane.

Spatial filter 35 is designed to be attuned to the Fourier transform of the full planar figure of rotation diffused into the two regions of wafer 18. Thus the light coming from those two regions is highly correlated with the pattern of spatial filter 35. Light through filter 35 corresponding to either such region, upon being passed through an imaging, will produce the recognition spot characteristic of such high correlation in an image plane.

Lenses 38 and 39 are imaging lenses designed to display the two recognition spots respectively on position detectors 41 and 42, which are in the focal plane of these lenses. Each of these position detectors is divided into four separate infrared photodetector regions. For example detector 41 is divided into four regions 45, 46, 4 and 47 and 48, with a common intersection at a point of alignment 49. If the system were in perfect alignment, the recognition spot corresponding to detector 41 would fall on point 49.

However, if the region on wafer 18 corresponding to detector 41 were too high, the spot would fall completely or mostly in photodetector region 47. If too low, the spot would fall in region 45; if too far left (viewed from detector 41), the spot would fall in region 46; and if too far right, in region 48. Numerous electrical error systems can be devised to develop an error signal from detectors such as 41 and 42.

One such error system takes the output from region 47 on line 51 and the output from region 45 on line 52 and compares these two outputs in differential amplifier 53 to generate a vertical error signal on line 54. Line 54 is connected to servomotor 24 to control the vertical displacement of the left side of water holder 19. Similarly, regions 46 and 48 feed amplifier 55 through lines 56 and 57 to generate a horizontal error signal on line 58. The horizontal error signal controls servomotor 23 to control the horizontal displacement of the lower side of wafer holder 19.

Similarly, detector 42 operates with amplifiers 62 and 63 to control servomotors 21 and 22, controlling the displacement of the upper and right sides of the wafer holder.

It is obvious that the position control system associated with position detectors 41 and 42 are not independent as described. That is, in the absence of other factors, a movement to correct the position of one recognition spot will alter the position of the other spot. However, assuming that the other position control system is operating properly, it will operate to correct the altered position of the other spot, with progressively diminishing errors for both spots.

Figure 3:
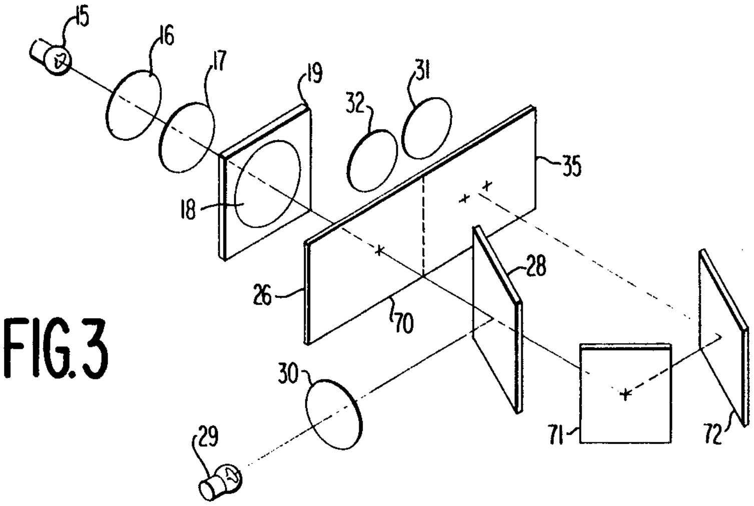
FIG. 3 is an illustration of an alternate embodiment of part of the system of FIG. 2.

To eliminate alignment problems between the photomask 26 and the spatial filter 35, they may be placed on the same mask holder or substrate 70, as in FIG. 3. This arrangement eliminates the need for separate alignment of photomask 26 to the optical axis of the system. The monochromatic infrared light for alignment of the wafer 18 comes from source 15 through lens system 16 and 17, through wafer 18, photomask 26 and mirror 28 to a mirror 71. Mirror 71 bends this light by 90° to pass to a mirror 72. Light from mirror 71 is bent by 90° by mirror 72 and is focused on the spatial filter 35.

Before light from source 29 is used to expose the photoresist, the alignment system of FIG. 2, or as modified in FIG. 3, has aligned the wafer with spatial filter 35. When photomask 26 has been aligned with filter 35 or is permanently aligned on holder 70 with filter 35, the alignment system thereby aligns the wafer for subsequent exposure of the photoresist through the photomask.

Figure 4:
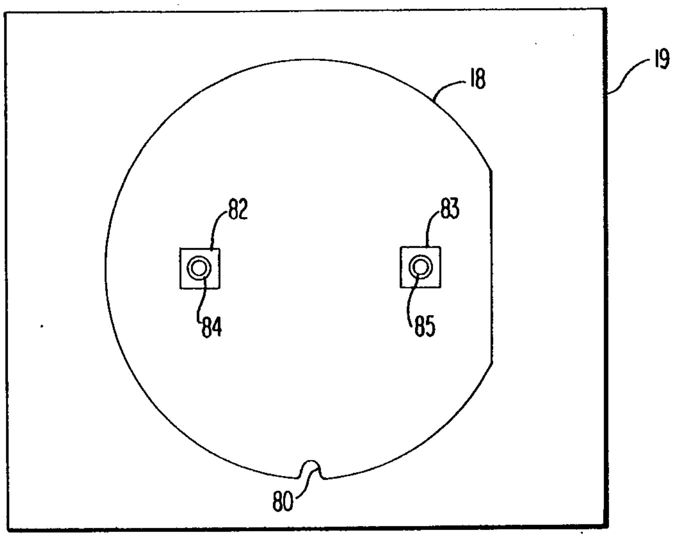
FIG. 4 is an illustration of a semiconductor wafer and wafer-holder as used in the present invention.

FIG. 4 is a diagram of a wafer 18, having alignment regions 82 and 83 according to the present invention, and arranged in a wafer holder 19. The wafer has one flat region 81 along its edge and a notch 80 at another point on the edge. The flat region and the notch fit corresponding regions of the holder 19 to assure that, when the wafer is inserted into the holder, it is already in approximate alignment. This approximate alignment assures that the recognition spots in FIG. 2 will fall somewhere on position detectors 41 and 42.

Alignment regions 82 and 83 contain identical full planar figures of rotation 84 and 85. These figures of rotation may be formed by diffusion techniques used in the fabrication of the wafer. The diffused figures may be formed as the result of subcollector fabrication. However, the figures may also be patterns etched on the surface of the wafer in a manner well known in the art. Any suitable method of forming the figures may be used.

While the invention has been particularly shown and described with reference to a preferred embodiment thereof, it will be understood by those skilled in the art that various changes in form and details may be made therein without departing from the spirit and scope of the invention.

What is claimed is:

1. A method of providing reference regions for alignment of a semiconductor wafer having spaced regions therein comprising:

forming by techniques employed during the fabrication of said wafer a separate reference pattern in at least two spaced regions in said wafer, and forming each of said patterns so that it:

a. has a spatial frequency content distinct from the potions of said wafer outside said regions, and b. defines an alignment pattern consisting of a planar figure of rotation contained within the plane of said wafer.

2. A method according to claim 1 further comprising forming identical figures of rotation in each of said spaced regions.

3. A method according to claim 1 further comprising forming said figure of rotation by diffusion techniques.

4. A method according to claim 1 further comprising forming said figure of rotation by etching techniques.

5. A method of orienting a semiconductor wafer having spaced regions therein formed in accordance with claim 1, further comprising:

a. providing a complex spatial filter representing said figure of rotation and responsive to light of a preselected wavelength, b. directing a beam of coherent monochromatic light of said wavelength against said wafer to form in an image plane through said filter at least two recognition spots of light whose positions in said image plane relative to respective reference positions are dependent upon the relative degree of alignment of said wafer and said filter, c. producing error signals respectively indicative of the relative displacement between each of said recognition spots and its associated reference positions, and d. controlling, in response to said error signals, the position of said wafer to reduce said relative displacement.

6. A method of orienting a semiconductor wafer having spaced regions therein and provided, by techniques employed during the fabrication of said wafer, with a separate reference pattern in at least two spaced regions in said wafer, the patterns having a spatial frequency content distinct from the portions of said wafer outside said regions and defining identical full planar figures of rotation, comprising:

a. providing a complex spatial filter representing said figure of rotation and responsive to light of a preselected wavelength, b. directing a beam of coherent monochromatic light of said wavelength through said wafer and said filter to form an image plane at least two recognition spots of light whose positions in said image plane relative to respective reference positions are dependent upon the relative degree of alignment of said wafer and said filter, c. producing error signals respectively indicative of the relative displacement between each of said recognition spots and its associated reference position, and d. controlling in response to said error signals the respective position of said wafer to reduce said relative displacement.

7. A system for orienting a piece of semiconductor material with respect to a photomask comprising:

a. a source of monochromatic infrared light, b. a plurality of regions on said piece having a pattern of transmission of light corresponding to a full planar figure of rotation, c. means for directing said light through said regions, d. a complex spatial filter of said figure of rotation in a frequency plane, e. means for distributing said light directed through said regions into said frequency plane in a pattern corresponding to the Fourier transform of said figure of rotation, f. means responsive to the correlation between said light directed into said frequency lane and said spatial filter for generating a plurality of recognition spots in an image plane, the displacement of said recognition spots from respective points of alignment of said piece of said filter, g. means responsive to the displacement of said spots from alignment for generating error signals, h. means responsive to said error signals for reducing said displacement from alignment of said piece and said filter, and i. means for maintaining said photomask and said filter in fixed spatial relationship, whereby alignment of said piece with said filter thereby aligns said piece with said photomask.

8. A method of providing reference regions in a transparent workpiece having spaced regions therein comprising forming by techniques employed during the fabrication of said workpiece a separate reference pattern in at least two spaced regions in said workpiece, and forming each of said patterns so that it:

a. has a spatial frequency content distinct from the portions of said workpiece outside said regions, and b. defines a full planar figure of rotation.

9. A method according to claim 8 further comprising forming identical figures of rotation in each of said spaced regions.